Figure 1:
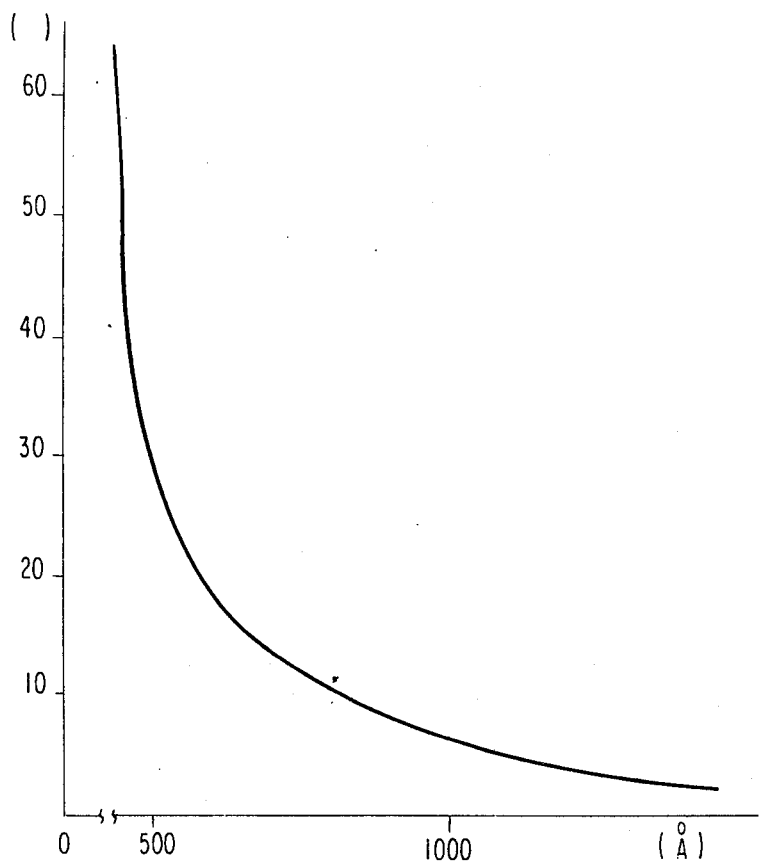

United States Patent [19]
Yoshikawa et al.

[11] 4,049,859
[45] Sept. 20, 1977

[54] METALLIZED FILM

[75] Inventors: Shinsuke Yoshikawa; Tohru Sasaki; Syuuzi Terasaki, all of Iwaki, Japan

[73] Assignee: Kureha Kagaku Kogyo Kabushiki Kaisha, Tokyo, Japan

[21] Appl. No.: 654,820

[22] Filed: Feb. 3, 1976

[30] Foreign Application Priority Data

Feb. 3, 1975  Japan ................................. 50-13320

[51] Int. Cl.$^2$ .......................................... H01L 41/10
[52] U.S. Cl. ....................................... 428/172; 427/81; 427/100; 428/213; 428/216; 428/333; 428/336; 428/339; 428/461; 428/462; 428/463
[58] Field of Search ............... 428/461, 462, 463, 156, 428/213, 215, 216, 172, 332, 333, 336, 339; 427/100, 81

[56] References Cited

U.S. PATENT DOCUMENTS

| | | | |
|---|---|---|---|
| 2,302,024 | 11/1942 | Goss, Jr. .............................. | 427/106 |
| 3,712,849 | 11/1973 | Robbiati .............................. | 428/213 |
| 3,912,830 | 10/1975 | Murayama et al. .................. | 427/100 |

Primary Examiner—George F. Lesmes
Assistant Examiner—Stanley S. Silverman
Attorney, Agent, or Firm—Sughrue, Rothwell, Mion, Zinn and Macpeak

[57] ABSTRACT

Metallized plastic films having deposited metal layers on both surfaces and being adapted for use as dielectric films, piezoelectric films or pyroelectric films are disclosed. At least a portion of the metal layer deposited on one surface of the film has a relatively increased thickness of 700 A or more and at least a portion of the metal layer deposited on the other surface has a relatively reduced thickness of 600 A or less. The increased thickness and reduced thickness portions are positioned opposite to one another. The thin layer permits rapid self recovery of localized dielectric breakdown, while the relatively thick layer provides better utility for the electric uses to which the film is put.

7 Claims, 3 Drawing Figures

METALLIZED FILM

BACKGROUND OF THE INVENTION

This invention relates to metallized films which are prepared by depositing metal layers on a thermoplastic synthetic resin film. More specifically, this invention relates to a metallized thermoplastic resin film for electric uses, e.g. as dielectric, piezoelectric or pyroelectric elements. Films of the nature mentioned have electrodes on both surfaces thereof formed by depositing metal layers thereon by vapor deposition or the like, wherein the said electrodes are constructed so that the film can easily self-recover from localized dielectric breakdowns developed therein due to the application of voltage.

DESCRIPTION OF THE PRIOR ART

Electric devices comprising a film having deposited metal layers on both surfaces thereof include metallized capacitors, piezoelectric elements, pyroelectric elements or the like. The thickness of the deposited layer is usually between 0.05 and 0.1 $\mu$. The extremely small thickness of these layers is advantageous in achieving miniturization of electric devices and, additionally, as is well-known, provides the further advantage of a so-called self recovery effect. That is, in the case of dielectric breakdown of the film, due to voltage application, the areas of the deposited layer where dielectric breakdown occurs are evaporated off, thereby resulting in these areas becoming insulators again and recovering the entire function of the electric element.

It is well known, for example, that a piezoelectric element can be prepared by forming deposited layers on both surfaces of a high molecular-weight film, e.g. polyvinylidenefluoride, and then applying a DC voltage between said electrodes under a heating condition to form an electret. The piezoelectric constant of the film obtained as the result of said polarization increases as the applied voltage and temperature during the polarization increases. Industrial applications of such a piezoelectric element include its use for example, as an oscillating membrane in an acoustic transducer and a pressure sensitive element in a mechanical-electrical transducer. These industrial applications require an extremely high piezoelectric performance for said piezoelectric film, such as having a piezoelectric constant $d_{31}$ between $10^{-7}$ and $10^{-6}$ c.g.s.e.s.u. In order to achieve such high piezoelectric constants, it becomes necessary to polarize the film under conditions in excess of 120° C and 700 KV/cm. This means that the polarization must be performed under conditions whereby local dielectric breakdowns are liable to occur in those areas of the film which have reduced thickness or are contaminated with conductive impurities. Such areas are hereafter referred to as "yielded" areas.

However, if the electrodes are short circuited due to such localized dielectric breakdown, electrical self recovery action takes place because the areas of the electrodes adjacent to the yielded areas of the metallized film are evaporated due to the heat. So long as the evaporation of the electrodes is not significant, the film can be used some time as it is depending on the particular application. In some cases it is possible simply to restrict use to those areas which have not had any breakdown. On the other hand, a higher energy for the dielectric breakdown not only results in large perforations in the yielded area but also evaporates over a large area the portions of the electrodes adjacent to said perforation to increase the loss. The dielectric breakdown sometimes extends to the adjacent areas and thereby continues the short circuits before the self recovery of the film takes place and renders the polarization work impossible.

Since the energy released at the dielectric breakdown is generally determined depending on the electric quantity stored between the electrodes of the polarized film and the voltage applied thereacross, said energy and the damage caused thereby can be decreased by the reduction of the electrostatic capacity in a polarized film, which can be achieved, for example, by dividing at least one of the electrodes provided on both surfaces of the film into smaller segments or areas to thereby decrease the area of the film to be polarized at a time. While the yielded portion of a film resulting from the dielectric breakdown may be propagated by the carbonization of the film due to high energy, most of such propagations are considered to occur because of other reasons. If thicker electrodes are used, those areas of the film adjacent to the yielded portion are melted, or the temperature of said areas increases, before self-recovery by evaporation of the electrodes to thereby degrade the dielectric withstand performance of the areas, to which the dielectric breakdown propagates.

The above description of the polarization of metallized films is also applicable to the use of such film to manufacture capacitors.

Where the metallized film described above is used for the manufacture of capacitors, or piezoelectric or pyroelectric elements, it is necessary to provide electrical wirings for the metallized film. If the deposited metal layer is thin at the portion where the wire leads are connected, disconnection failures are liable to occur because of the increase in the electric resistivity at the connected portion or the oxidation or electrolytic corrosion caused to said deposited metal layer, which renders said connected portion non-conductive. In using piezoelectric elements, prepared by polarizing metallized films, for a mechanical-electrical transducer, thicker films are more advantageous since the elasticity and hence the response velocity of the films are improved as the thickness of the films increases.

When the piezoelectric elements are used as deformable and oscillating membranes in an acoustic apparatus such as a microphone, loud speaker, headphone, or the like, their sensitivity can be improved also by the increase in the elasticity.

It is thus apparent that there are conflicting requirements placed on the deposited metal layers. Thick metal layers suit certain requirements and thin metal layers suit others. Both also have disadvantages, as explained previously.

SUMMARY OF INVENTION

It is therefore an object of the present invention to provide improved metallized films for electrical uses, which films have deposited layers satisfying the conflicting requirements as mentioned previously.

This and other objects of the invention are achieved by selecting the thickness of the metal layers on opposing surface portions of the thermoplastic film to be thin and thick, respectively. The thin portion is thin enough to vaporize rapidly in response to the electric discharge created during dielectric breakdown, thereby providing the desirable function of rapid self healing of localized dielectric breakdowns. The thick portion is thick enough to provide the needed physical properties of the metallized film during use.

DESCRIPTION OF THE ACCOMPANYING DRAWINGS

Figure 2:
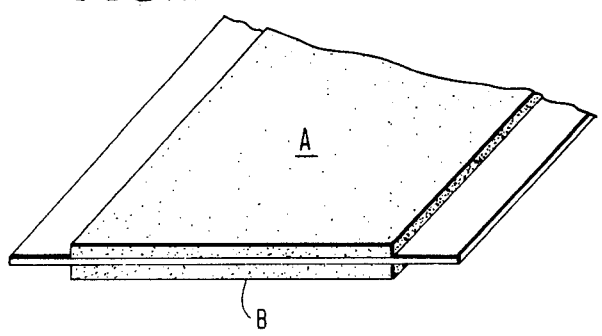
Figure 3:
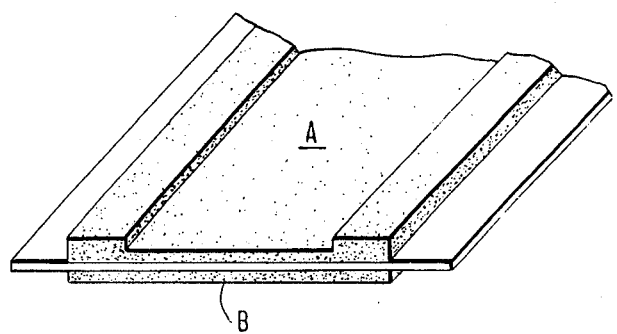

FIG. 1 is a view showing the relation between the thickness of a deposited aluminum layer and its electric resistivity; and FIG. 2 and FIG. 3 are the views for the illustration of this invention showing the layers of metal deposition.

DESCRIPTION OF THE INVENTION

The inventors have discovered that rapid self-recovery from the dielectric breakdown in a metallized film having electrode layers deposited on both surfaces can be achieved by decreasing the thickness of the electrode layer on only one of the surfaces of the film. When electric sparks are generated at the time of the dielectric breakdown, a thinner electrode layer is instantaneously evaporated by the heat generated through said sparks, by which the electrical conduction between two electrodes are disconnected to effect self-recovery. Therefore, the electrode layer on the opposite surface of the film can be as thick as desired without effectng the rapid self recovery of the device. Where the thickness of the electrode is required to be increased only at the areas to which the electric wirings are to be connected, the thickness of the electrode on the opposite surface can be decreased only at the areas directly opposite said connection areas. Therefore, the film may comprise the thicker and thinner portions at both surfaces.

Since Young's modulus of a metallized film is determined depending on the sum of the thickness of the deposited metal layers on both surfaces, provided the thickness of the synthetic resin film is kept constant, the thickness of the deposited metal layer at one surface may be reduced with no attendant problems if the deposited metal layer on the other surface has sufficient thickness.

This invention provides a metallized film comprising deposited metal layers on both surfaces thereof wherein a part of the metal layers on one or both surfaces or the entire part of the layer on one surface of the film is made relatively thick, e.g. 700A or more, and the deposited metal layer on the opposite surface at the areas corresponding to said thicker portion on said one surface are made relatively thin, e.g. 600A or less. The metallized film easily self-recovers from localized dielectric breakdown.

The synthetic resin film used as a substrate for the metallized film in this invention includes, for example, a thermoplastic resin film comprising polyethylene, polypropylene, polyvinylchloride, polyvinylidenechloride, polyvinylfluoride, polyvinylidenefluoride, polytetrafluoroethylene, polyamide, polyethyleneterephthalate, polycarbonate, polystyrene, polymethylmethacrylate or polyacrylonitrile, or copolymers composed of monomers constituting the foregoing polymers, as well as like other various thermoplastic synthetic resins.

The metal used for the deposition may be any metal capable of vapor deposition, for example, aluminum, tin, zinc, chromium, nickel, copper, silver, gold, platinum, tungsten or the like. While the thickness of the deposited layer is 700A or more in the thicker area and has no upper limit, it usually ranges between 700 and 5000 A and, more preferably, between 800 and 3000 A, since a too thick deposition layer requires repeated vapor deposition and results in an excessively high Young's modulus. Also the thin deposited layer is specified as less than 600 A, if the layer is too thin it will result in a loss of electroconductivity. The lower limit at which electroconductivity is lost depends upon the metal used, and while the thickness of 300 A or more is required for aluminum and the like, which easily undergoes surface oxidation, the reduced thickness as low as 100 A may be sufficient for gold and the like, not liable to undergo said surface oxidation. The thickness of the deposited metal layer preferably ranges between 100 and 550 A. Where the thickness of the deposited layers is less than 700 A on both surfaces of a film except the thicker portions of more than 700 A on one surface, the deposited layer on the opposite surface of the film is desirably less than 600 A for easier self-recovery.

The thickness of a deposited layer can be observed directly by way of an electronic microscope by setting the film with epoxy resin, for example, and cutting sectionally along the depth to prepare slices. It can also be determined by way of its electric resistivity by previously determining the relation between the thickness of the deposited layer and the electric resistivity thereof. The relation between the thickness of a deposited aluminum layer measured by an electronic microscope and its electric resistivity is shown as a graph in FIG. 1. All of the film thicknesses in the examples to be described hereinafter, where the aluminum films are used alone, are determined according to this graph by means of the electric resistivity.

EXAMPLE 1

Polyvinylidenefluoride having inherent viscosity, $\eta_{inh}$, of 1.0 and prepared through suspension polymerization is extruded under molten state into a sheet and then monoaxially stretched by a factor of 5 to prepare an elongated stretched film of a thickness of $9 \pm 0.5\ \mu$ and a width of 140 mm. Then, aluminum thin layers are vapor deposited on both surfaces of the film leaving marginal blanks of 20 mm width along both of the longitudinal peripheral sides as shown in FIG. 2. The metallized film is cut into one meter length of film units each having a varied depth of deposited aluminum layers on both of the surfaces A and B, and the film unit is pinched with clips at the marginal blanks and stretched. Two sheets of tin foils of 10 $\mu$ thickness are used as electrodes and each of them is bonded to each of the ends of the deposition surfaces over bonding areas of 40 mm width × 500 mm length by means of an electroconductive paint respectively. Then, the device thus prepared is applied with DC voltage for 5 minutes under dried condition at 120° C. The increasing rate of the applied voltage is about 20V/sec. The result is shown in table 1.

| Specimen No. | Deposition thickness (A) A | B | Voltage (Kv/cm) | Results of polarization | State of polarization | Piezoelectric constants ($d_{31}$c.g.s.e.s.u.) |
|---|---|---|---|---|---|---|
| 1 | 1100 | 1000 | 550 | failed | Three successive dielectric breakdowns occurred during voltage increase at 500 Kv/cm | — |

-continued

| Specimen No. | Deposition thickness (Å) A | B | Voltage (Kv/cm) | Results of polarization | State of polarization | Piezoelectric constants ($d_{31}$ c.g.s.e.s.u.) |
|---|---|---|---|---|---|---|
| 2 | 1500 | 750 | 550 | failed | to result in short circuits. A short circuit occurred at 550 Kv/cm during the voltage increase. | — |
| 3 | 1100 | 650 | 650 | failed | Self-recovery occurred after the voltage application, but a dielectric breakdown again occurred resulting in a short circuit after 2 min. | — |
| 4 | 1100 | 550 | 650 | succeeded | Self-recovered twice from electric breakdown until the end of polarization | $6.8 \times 10^{-7}$ |
| 5 | 1000 | 500 | 750 | succeeded | Self-recovered four times until the end of polarization | $8.0 \times 10^{-7}$ |
| 6 | 1100 | 400 | 750 | succeeded | Self-recovered three times until the end of polarization | $7.8 \times 10^{-7}$ |
| 7 | 800 | 650 | 750 | failed | Self-recovered 30 sec. after the voltage application but short circuits appeared again within 2 min. | — |
| 8 | 800 | 500 | 750 | succeeded | Self-recovered until the end of polarization, | $8.2 \times 10^{-7}$ |
| 9 | 750 | 450 | 750 | succeeded | Self-recovered three times until the end of polarization | $8.2 \times 10^{-7}$ |
| 10 | 650 | 650 | 750 | failed | Successive dielectric breakdown four times to result in short circuits 30 sec. after voltage application | — |
| 11 | 500 | 500 | 750 | succeeded | Self-recovered twice | $8.2 \times 10^{-7}$ |

As can be seen from the table 1, short circuit failures are observed to have resulted from two different types of phenomena. The first type of short circuit is caused by the contiguous propagation of the yielded portion to adjacent areas due to the incomplete evaporation of the deposited aluminum thin layers in which said breakdown occurs, and the second type of the short circuit is caused by the film fusing at the yielded portions to form perforations of about 10 mm diameter. The results prove that polarization can be accomplished by the evaporation of aluminum, on the surface having the thinner deposition layer, to form an insulation area.

It is shown by the results of the foregoing polarization experiments that the thickness of a deposited layer should be less than 600 A, at least on one surface, for easier self-recovery.

While the self-recovery can easily be attained as seen from the results of the specimen no. 11 with less than 500 A thickness of the layer on both surfaces of the film, thicker layers are more advantageous in view of the improved elasticity since the piezoelectric films are used in such applications as detecting voltages from mechanical distortion applied instantaneously or detecting the mechanical distortion produced from the application of voltages as described previously.

In a piezoelectric film of polyvinylidenefluoride with a 9μ thickness, for example, the modulus of elasticity of $3 \times 10^{10}$ dyne/cm² of the film having 450 A thickness of vapor deposition layers at both surfaces of the film can be increased to $3.6 \times 10^{10}$ dyne/cm², and the difference is of significant importance when said piezoelectric film is used as an oscillating membrane in an acoustic transducer in view of the sensitivity for acoustic pressure, tone quality or the like.

EXAMPLE 2

Aluminum is vapor deposited to a thickness of 500 A on both surfaces of the same monoaxially stretched polyvinylidenefluoride film as used in the example 1 while leaving marginal blanks of 20 mm width along both peripheral sides of said surfaces. Then, a further deposition is again applied over a 20 mm width along the peripheral portions of the vapor deposited area on the film surface A to prepare a metallized film as shown in FIG. 3. The thickness of the deposited layers at the above overlapped deposition areas are 900 A. When the polarization is effected on this film as in the example 1, the film self recovered from the three dielectric breakdowns during the polarization to result in a piezoelectric film having piezoelectric constant $d_{31}$ of $8.0 \times 10^{-7}$ c.g.s.e.s.u.

EXAMPLE 3

A copolymer having inherent viscosity, $\eta_{inh}$, of 1.1 and prepared from 90 parts by weight of polyvinylidenefluoride and 10 parts by weight of tetrafluoroethylene through suspension polymerization was pressed into a sheet, which was stretched biaxially by a factor of three in the respective directions to prepare a film of a thickness of 12μ ± 0.5μ. A specimen of 10 cm square was cut from the above film, and gold was deposited on the both surfaces thereof while leaving blanks of 10 mm width along the peripheral edges. Then, an aluminum membrane was further vapor deposited over the gold deposition on one surface, and 700 Kv/cm of DC voltage was applied for 10 minutes at 120° C. No short circuit failures occured.

In another 10 cm square specimen a pin hole was formed in the film at the central area of the deposited metal, and the polarization was conducted under the same conditions as above described. A momentary short circuit resulted during the course of increasing the applied voltage, but the film soon self recovered, and the polarization succeeded without any trouble.

The resultin polarized film produced in this example had a piezoelectric constant of $3.5 \times 10^{-7}$ c.g.s.e.s.u. The thickness of the deposited layers on the film was about 900 A on one surface and about 300 A on the other surface, as measured by an electronic microscope.

EXAMPLE 4

A copolymer having an inherent viscosity, $\eta_{inh}$, of 1.15 and prepard from 90 parts by weight of vinylidenefluoride, 5 parts by weight of tetrafluoroethylene and 10 parts by weight of vinylfluoride through suspension polymerization was pressed into a sheet, which was stretched biaxially by the factors of three in both of the directions respectively to prepare a film of $12\mu \pm 0.5\mu$. A specimen of 10 cm square was cut from the above film, and a mixture comprising nickel and tungsten was applied thereto by vapor deposition, while leaving blanks of a 10 mm width along the peripheral sides on both surfaces. Aluminum was further vapor deposited on one surface of the metallized film, and then a DC voltage was applied for 5 minutes as in the example 3. Although a momentary short circuit resulted during the polarization after perforating pin holes therein the film soon self-recovered from the failures, and the polarization thereafter succeeded without any trouble.

The polarized film produced in this example had a piezoelectric constant of $2.5 \times 10^{-7}$ c.g.s.e.s.u. The thickness of the deposited layer was about 950 A on one surface and about 400 A on the other surface, as measured by an electron microscope.

What is claimed is:

1. In a metallized thermoplastic resin film constituting a transducer and having deposited metal layers on both surfaces thereof, the improvement comprising, at least a portion of said metal layer on one surface of said film having a first thickness between 700–5000A, and at least a portion of said metal layer the other surface of said film, at positions on said other surface opposite to the position of said first thickness portion, having a second thickness between 100–600 A.

2. A metallized plastic film as defined in claim 1, wherein the entire metal layer deposited on said one surface has a thickness between 700 and 5000 A and the entire metal layer deposited on said other surface has a thickness between 100 and 600 A.

3. A metallized plastic film as defined claim 1, wherein a part of the metal layer deposited on said one surface has a thickness between 100 and 600 A.

4. A metallized plastic film as defined in claim 3, wherein a part of the metal layer deposited on said other layer has a thickness of between 700 A and 5000 A, said latter part being opposite the said second thickness part on said one surface.

5. A metallized plastic film as defined in claim 1, wherein the metal for deposition comprises at least one of the metals selected from the group consisting of aluminum, tin, zinc, chromium, nickel, copper, silver, gold, platinum, and tungsten.

6. A metallized plastic film as defined in claim 1, wherein the plastic film is a thermoplastic resin selected from the group consiting of at least one of polymers of polyethylene, polypropylene, polyvinylchloride, polyvinylidenechloride, polyvinylfluoride, polyvinylidenefluoride, polytetrafluoroethylene, polyamide, polyethyleneterephthalate, polycarbonate, polystyrene, polymethylmethacrylate and polyacrylonitrile, and copolymers of at least two monomers constituting the latter polymers.

7. A metallized plastic film as defined in claim 1, wherein said metallized film is a polyvinylidenefluoride film and said deposited metal layers include aluminum.

* * * * *